(12) United States Patent
Byun et al.

(10) Patent No.: US 10,120,593 B2
(45) Date of Patent: Nov. 6, 2018

(54) METHOD OF CONTROLLING TEMPERATURE OF NON-VOLATILE STORAGE DEVICE

(71) Applicant: Samsung Electronics Co., Ltd., Suwon-si (KR)

(72) Inventors: Jae-beom Byun, Suwon-si (KR); Hu Zhao, Hwaseong-si (KR); Jong-gyu Park, Hwaseong-si (KR); Do-il Kong, Hwaseong-si (KR); Chung-hyun Ryu, Hwaseong-si (KR); Eok-soo Shim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 175 days.

(21) Appl. No.: 15/160,212

(22) Filed: May 20, 2016

(65) Prior Publication Data

US 2016/0342346 A1 Nov. 24, 2016

(30) Foreign Application Priority Data

May 22, 2015 (KR) .................... 10-2015-0071935

(51) Int. Cl.
| | | |
|---|---|---|
| G06F 12/00 | (2006.01) |
| G06F 3/06 | (2006.01) |
| G11C 5/04 | (2006.01) |
| G11C 7/04 | (2006.01) |

(52) U.S. Cl.
CPC .......... *G06F 3/0616* (2013.01); *G06F 3/0613* (2013.01); *G06F 3/0634* (2013.01); *G06F 3/0685* (2013.01); *G11C 5/04* (2013.01); *G11C 7/04* (2013.01)

(58) Field of Classification Search
CPC .... G06F 3/0616; G06F 3/0613; G06F 3/0634; G06F 3/0685; G11C 5/04; G11C 7/04
See application file for complete search history.

(56) References Cited

U.S. PATENT DOCUMENTS

| | | |
|---|---|---|
| 7,640,392 B2 | 12/2009 | Walker |
| 7,768,856 B2 | 8/2010 | Fook et al. |
| 8,213,255 B2 | 7/2012 | Hemink et al. |
| 8,593,897 B2 | 11/2013 | Kato et al. |
| 8,861,995 B2 | 10/2014 | Park et al. |

(Continued)

FOREIGN PATENT DOCUMENTS

| | | |
|---|---|---|
| JP | 102006065945 | 3/2006 |
| KR | 1020060043974 | 5/2006 |

(Continued)

OTHER PUBLICATIONS

Ahn, et al., "Thermal-aware Test Scheduling for Highly Integrated SOC", Nov. 18, 2010.

*Primary Examiner* — Matthew Bradley
(74) *Attorney, Agent, or Firm* — Onello & Mello, LLP.

(57) ABSTRACT

A method of controlling a temperature of a non-volatile storage device includes determining whether the temperature of the non-volatile storage device is greater than a control engagement temperature, and adjusting a data I/O performance level P when the temperature of the non-volatile storage device is greater than the control engagement temperature. The non-volatile storage device may operate at the maximum performance level in a range in which the non-volatile storage device is protected from heat.

17 Claims, 8 Drawing Sheets

(56) References Cited

U.S. PATENT DOCUMENTS

| | | |
|---|---|---|
| 2013/0080679 A1 | 3/2013 | Bert |
| 2013/0223143 A1 | 8/2013 | Cho et al. |
| 2014/0115366 A1 | 4/2014 | Joo et al. |
| 2016/0085458 A1* | 3/2016 | Skandakumaran ... G06F 3/0613 710/313 |

FOREIGN PATENT DOCUMENTS

| | | |
|---|---|---|
| KR | 1020080065065 | 7/2008 |
| KR | 1020140118555 | 10/2014 |

* cited by examiner

METHOD OF CONTROLLING TEMPERATURE OF NON-VOLATILE STORAGE DEVICE

CROSS-REFERENCE TO RELATED APPLICATION

This application claims the benefit of Korean Patent Application No. 10-2015-0071935, filed on May 22, 2015, in the Korean Intellectual Property Office, the disclosure of which is incorporated herein in its entirety by reference.

BACKGROUND

The inventive concepts relate to a method of controlling a temperature of a non-volatile storage device, more particularly, to a method in which the non-volatile storage device may operate at the maximum performance level while the non-volatile storage device is protected from heat.

The operation and reliability of a semiconductor used in a solid state drive (SSD) are guaranteed in a specific temperature range. In this regard, the SSD is required to be used within the certain temperature range, and for a case in which the SSD is used outside of the aforementioned range, a method of reducing power consumption in order to control the temperature of the SSD has been developed.

SUMMARY

The inventive concepts provide a method of controlling the temperature of a non-volatile storage device in which the non-volatile storage device operates at the maximum performance level in a range in which the non-volatile storage device is protected from heat.

The inventive concepts provide a non-volatile storage device which operates at the maximum performance level in a range in which the non-volatile storage device is protected from heat.

According to an aspect of the inventive concepts, there is provided a method of controlling a temperature of a non-volatile storage device. The method may include determining whether a temperature of the non-volatile storage device is higher than a control engagement temperature, and adjusting data I/O performance level P according to Formula (2) below if the temperature of the non-volatile storage device is higher than the control engagement temperature.

$$P = P_{max} \times \beta \times \left(1 - \alpha \frac{\Delta T}{\Delta T_b}\right) \quad (2)$$

$P_{max}$ denotes a maximum data I/O performance level of the non-volatile storage device.

$\Delta T$ denotes a difference between the temperature of the non-volatile storage device and a reference temperature.

$\Delta T_b$ denotes a difference between a maximum threshold temperature of the non-volatile storage device and the reference temperature.

$\alpha$ and $\beta$ are control parameters of the non-volatile storage device.

The data I/O performance level may be a data I/O speed. In some embodiments, the adjustment of the data I/O performance level P may include controlling at least one of the number of data I/O channels and the number of ways, in order to control the data I/O speed. In some embodiments, the adjustment of the data I/O performance level P may include controlling a speed of a write/read operation with respect to the non-volatile memory, in order to control the data I/O speed. Here, the control of speed of the write/read operation with respect to the non-volatile memory is performed according to a Tprog function.

The reference temperature may be lower than the control engagement temperature. In some embodiments, the temperature of the non-volatile storage device may be represented by a value measured by a temperature measuring sensor disposed in the non-volatile storage device.

In some embodiments, the non-volatile storage device may include a substrate, a memory controller, a volatile memory, and a non-volatile memory that are mounted on the substrate. The temperature measuring sensor is disposed on a surface of or adjacent to at least one of the memory controller, the volatile memory, the non-volatile memory, and the substrate. Optionally, the temperature measuring sensor may be disposed on a semiconductor active surface of the volatile memory, the non-volatile memory, or a logic chip.

In some embodiments, the memory controller may be configured to receive a temperature value from the temperature measuring sensor and, based on the received temperature value, to control the data I/O performance level according to Formula (2). The memory controller may include a firmware capable of performing the determination of whether the temperature of the non-volatile storage device is higher than the control engagement temperature and the adjustment of the data I/O performance level P. Optionally, the firmware may be included in the volatile memory and the non-volatile memory.

The method of controlling a temperature of a non-volatile storage device may further include, after the adjustment of the data I/O performance level P, determining whether the temperature of the non-volatile storage device is lower than the control engagement temperature, and setting the data I/O performance level P to a maximum performance level $P_{max}$ if the temperature of the non-volatile storage device is lower than the control engagement temperature.

In some embodiments, the determination of whether the temperature of the non-volatile storage device is higher than the control engagement temperature is repeated at intervals. A period for determining of whether the temperature of the non-volatile storage device is higher than the control engagement temperature may be in a range of about one second to about one hour.

In some embodiments, the method may further include adjusting the data I/O performance level P according to Formula (2) if the temperature of the non-volatile storage device is higher than the control engagement temperature.

According to another aspect of the inventive concepts, there is a method of controlling a temperature of a non-volatile storage device. The method includes detecting a temperature at predetermined time intervals by using a temperature measuring sensor and sending a temperature value to a memory controller, and controlling, by using the memory controller, a speed of a write/read operation with respect to a non-volatile memory based on the temperature value.

The control of the speed of the write/read operation with respect to the non-volatile memory may include setting the write/read speed to a maximum value if the temperature is less than or equal to a control engagement temperature, and applying at least one of (a), (b), and (c) according to Formula (1) below if the temperature is higher than the control engagement temperature.

$$P = P_{max} \times f\left(\frac{\Delta T}{\Delta T_b}\right) \quad (1)$$

(a) reducing the number of data I/O channels,
(b) reducing the number of data I/O ways, and
(c) decreasing the speed of the data write/read operation with respect to the non-volatile memory.

$P_{max}$ denotes a maximum data I/O performance level of the non-volatile storage device.

$\Delta T$ denotes a difference between the temperature of the non-volatile storage device and a reference temperature.

$\Delta T_b$ denotes a difference between a maximum threshold temperature of the non-volatile storage device and the reference temperature.

Formula (1) is identical to Formula (2).

$$P = P_{max} \times \beta \times \left(1 - \alpha \frac{\Delta T}{\Delta T_b}\right) \quad (2)$$

α and β are control parameters of the non-volatile storage device.

In some embodiments, the control of the speed of the write/read operation with respect to the non-volatile memory comprises applying (c) decreasing the speed of the data write/read operation with respect to the non-volatile memory.

In some embodiments, the decrease of the speed of the data write/read operation with respect to the non-volatile memory is performed according to a Tprog function.

According to another aspect of the inventive concepts, a method of controlling a temperature of a non-volatile storage device is provided. The method includes setting data I/O performance level P to maximum level $P_{max}$, detecting a temperature of a non-volatile storage device, determining whether the temperature of the non-volatile storage device is higher than a control engagement temperature, adjusting the data I/O performance level P to a value lower than $P_{max}$ if the temperature of the on-volatile storage device is higher than the control engagement temperature, keeping the data I/O performance level P at $P_{max}$ if the temperature of the on-volatile storage device is equal to or lower than the control engagement temperature.

The non-volatile storage device includes a NAND memory, and the adjustment of the data I/O performance level P comprises controlling a speed of a write/read operation with respect to the non-volatile memory by using a Tprog function, in order to control the data I/O speed.

In some embodiments, the adjustment of the data I/O performance level P includes adjusting the data I/O performance level P according to Formula (2) below.

$$P = P_{max} \times \beta \times \left(1 - \alpha \frac{\Delta T}{\Delta T_b}\right) \quad (2)$$

$\Delta T$ denotes a difference between the temperature of the non-volatile storage device and a reference temperature.

$\Delta T_b$ denotes a difference between a maximum threshold temperature of the non-volatile storage device and the reference temperature.

α and β are control parameters of the non-volatile storage device.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
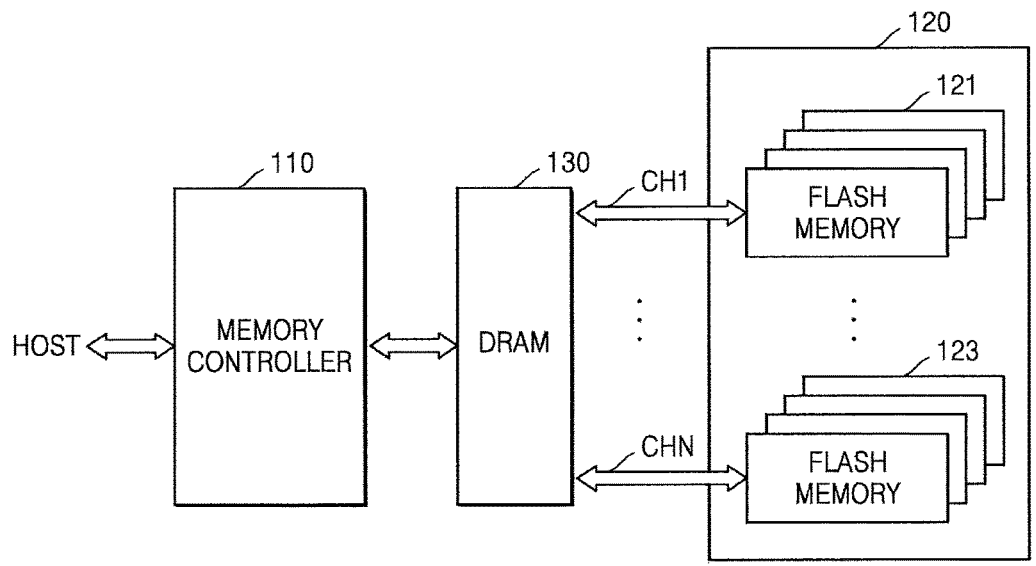
FIG. 1 illustrates a block diagram of a structure of a non-volatile storage device according to an example embodiment of the inventive concepts.

Hereinafter, the inventive concepts will now be described more fully with reference to the accompanying drawings, in which example embodiments of the inventive concepts are shown. The inventive concepts may, however, be embodied in many different forms and should not be construed as limited to the example embodiments set forth herein. Rather, these embodiments are provided so that this disclosure will be thorough and complete, and will fully convey the scope of the inventive concepts to one of ordinary skill in the art. In the drawings, like reference numerals denote like elements and the sizes or thicknesses of elements may be exaggerated for clarity of explanation. Expressions such as "at least one of" when preceding a list of elements, modify the entire list of elements and do not modify the individual elements of the list.

While such terms as "first" "second" etc., may be used to describe various components, such components must not be limited to the above terms. The above terms are used only to distinguish one component from another. For example, a first element could be termed a second element, and, similarly, a second element could be termed a first element, without departing from the scope of example embodiments.

The terms used in the present specification are merely used to describe particular example embodiments, and are not intended to limit the inventive concepts. An expression used in the singular encompasses the expression in the plural, unless it has a clearly different meaning in the context. In the present specification, it is to be understood that the terms such as "including", "having", etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms, including technical and scientific terms, used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

Example embodiments are described herein with reference to cross-sectional illustrations that are schematic illustrations of example embodiments. As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. As used herein, the term "and/or", includes any and all combinations of one or more of the associated listed items. Also, the term "substrate" used herein may refer to a substrate itself, or a stack structure including a substrate and a layer, film, or the like formed on a surface of the substrate. In addition the term "surface of a substrate" used herein may refer to an exposed surface of the substrate itself or an outer surface of a layer, film, or the like formed on the substrate.

FIG. 1 illustrates a block diagram of a structure of a non-volatile storage device according to an example embodiment of the inventive concepts.

Referring to FIG. 1, the non-volatile storage device 100 may include a memory controller 110 and a memory device 120.

For example, when the memory device 120 is embodied as a non-volatile memory device such as a flash memory device, the non-volatile storage device 100 may be a solid state drive (SSD). The SSD may also be referred to as a solid state device.

In FIG. 1, the memory device 120 includes flash memory devices 121 and 123. FIG. 1 illustrates a multi-bank structure in which four flash memory devices are combined for each channel.

The memory device 120 may be embodied not only as flash memory devices but also as other various types of non-volatile memory devices. For example, examples of the memory device 120 may include a phase change RAM (PRAM) device, a ferroelectric RAM (FRAM) device, and a magnetic RAM (MRAM) device as well as a flash memory device. The memory device 120 may be a structure including a combination of at least one non-volatile memory device and at least one volatile memory device, or may be a structure including at least two types of non-volatile memory devices.

The memory controller 110 may control operations of the non-volatile storage device 100 to read, write, or erase operations of the memory device 120, in response to a request issued from a host.

A data input/output (I/O) between the memory controller 110 and the host may include consecutive logical address units. In this case, an immediate I/O request may be defined as a request.

Channels may be formed between the memory controller 110 and the memory device 120 to deliver signals required for performing operations. Examples of the signals required for performing the operations may include a command, an address, or data. A channel refers to an independent signal path via which the memory controller 110 and the memory device 120 may transmit or receive signals to or from each other.

The non-volatile storage device 100 according to an example embodiment may include one or more channels between the memory controller 110 and the memory device 120. FIG. 1 illustrates an example in which N channels (wherein, N is a natural number) are formed between the memory controller 110 and the memory device 120.

Moreover, each of the channels may include a plurality of banks. In this case, the banks refer to memory devices sharing a channel with each other. The bank may also refer to as a way. Detailed examples of structures of the channel and the bank will be provided below.

Figure 6:
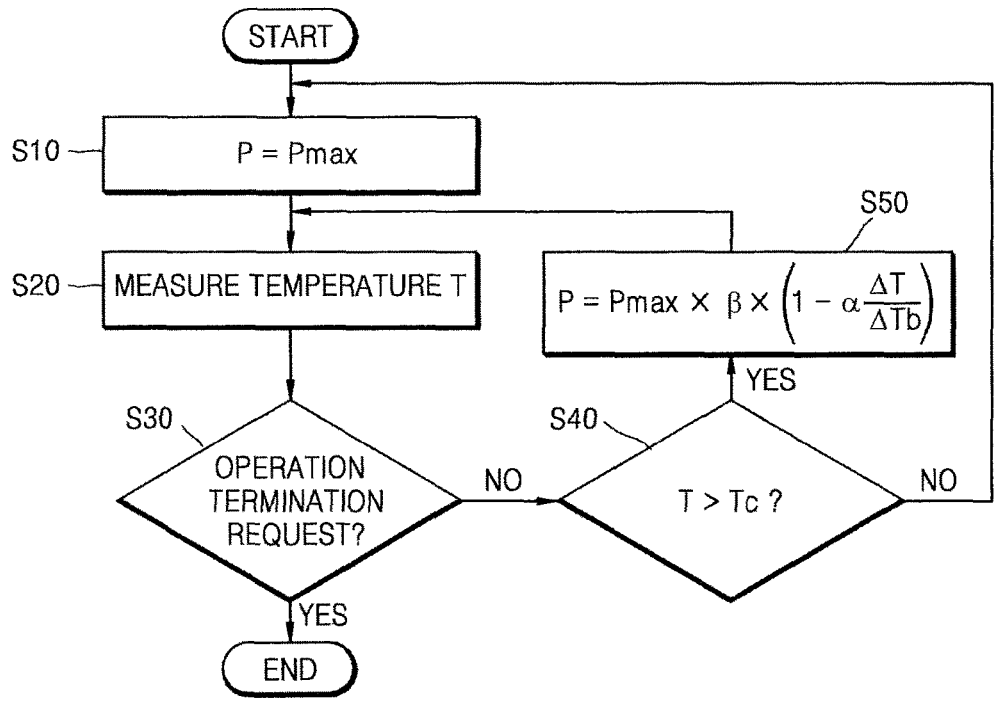
FIG. 6 illustrates a flowchart showing a method of controlling the temperature of the non-volatile storage device, according to example embodiments of the inventive concepts.

The memory controller 110 may control temperature of the non-volatile storage device 100 according to a flowchart of FIG. 6. Detailed operations of the memory controller 110 will be provided below.

Figure 2:
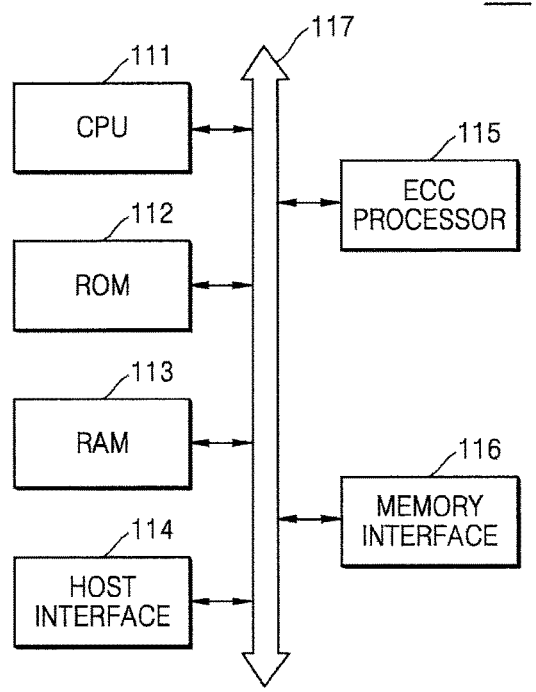
FIG. 2 is a block diagram illustrating a detailed structure of the memory controller of FIG. 1.

FIG. 2 is a block diagram illustrating a detailed structure of the memory controller 110 of FIG. 1.

Referring to FIG. 2, the memory controller 110 includes a central processing unit (CPU) 111, a read only memory (ROM) 112, a random access memory (RAM) 113, a host interface 114, an error correction code (ECC) processor 115, a memory interface 116, and a bus 117.

The components of the memory controller 110 may be electrically connected to each other via the bus 117.

The host interface 114 includes a protocol for exchanging data with a host that is connected to the non-volatile storage device 100, and interfaces the non-volatile storage device 100 with the host. The host interface 114 may be implemented, for example, by an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small Computer System (SAS) interface, a Small Computer System Interface (SCSI), an embedded Multi Media Card (eMMC) interface, or a Universal Flash Storage (UFS) interface, but is not limited thereto. The host interface 114 may be controlled by the CPU 111 to transmit or receive a command, an address, and data to or from a host.

The ROM 112 may store program codes and data that are required for controlling operations performed in the non-volatile storage device 100. For example, the ROM 112 may also store program codes for performing methods according to the flowchart of FIG. 6.

The RAM 113 may store a program code and data read from the ROM 112. Also, the RAM 113 may store data received via the host interface 114 or data received from the memory device 120 via a memory interface 116.

The ECC processor 115 may generate, in a write operation, an error correction code (ECC) for data to be received, by using an algorithm such as a Reed-Solomon code, a Hamming code, or a cyclic redundancy code (CRC). The ECC processor 115 may perform, in a read operation, an error detection and correction process for the received data, by using data and the read ECC.

The CPU 111 may control overall operations of the non-volatile storage device 100 by using program codes and data stored in the RAM 113.

For example, when the non-volatile storage device 100 is powered on, the CPU 111 may read program codes and data that are stored in the ROM 112 or the memory device 120, and required for controlling operations performed in the non-volatile storage device 100 in order to store to the RAM 113.

For example, when the non-volatile storage device 100 is powered on, the CPU 111 may read mapping table information and reliability information of each storage region from the memory device 120, and may store the read information to the RAM 113. In addition, before the non-volatile storage device 100 is powered off, the CPU 111 may read mapping table information and reliability information of each storage region from the RAM 113, and may write the read information to the memory device 120.

In some embodiments, when the non-volatile storage device 100 is powered on, the CPU 111 may read mapping table information from the memory device 120 to store to the RAM 113, and initialize reliability information of each storage region to store to the RAM 113. For example, upon initialization, reliability information of each storage region may be initialized, e.g., reliability values of each storage region may be set to be a default initial value. In some embodiments, reliability information of each storage region may be initialized based on program/erase cycle information for each storage region.

In some embodiments, the CPU 111 may perform a write or erase operation, and then initialize reliability information of the storage region where the write or erase operation was performed. For example, after performing a write or erase operation, the CPU 111 may initialize based on program/erase cycle information of each storage region.

The CPU 111 may determine a read parameter value of a storage region where a read operation will be performed, based on reliability information for the storage region of a memory device. For example, the read parameter may include a parameter for adjusting a read speed. The parameter for adjusting the read speed may include at least one of a parameter for determining a pre-charge voltage level of a memory device and a parameter for determining a development time.

For example, reliability information may be determined in a block unit or a page unit. In some embodiments, reliability information may be determined in a unit of a plurality of pages. Also, the reliability information may indicate one reliability level from among plural reliability levels. A read parameter value may be determined depending on a reliability level of reliability information for a storage region. For example, as a reliability level increases, a parameter value of a pre-charge voltage level or development time may be determined to increase a read speed. As a reliability level decreases, a parameter value of a pre-charge voltage level or development time may be determined to decrease a read speed.

The CPU 111 may perform a read operation, and then may perform an operation of updating reliability information for a storage region of a memory device, depending on quality of read data. For example, the CPU 111 may calculate the number of error bits detected from data obtained via a read operation executed by the ECC processor 115. The CPU 111 may also determine reliability information, based on the calculated number of error bits, of a storage region of a memory device where the read operation was performed. The CPU 111 may update reliability information of the storage region with the determined reliability information. For example, the number of error bits may be calculated in a page unit. For example, when the calculated number of error bits is greater than a preset upper reference value, reliability information is updated with a reliability level lower than a reliability level that is currently set for the storage region. When the calculated number of error bits is less than a lower reference value that is initially set, reliability information is updated to a reliability level higher than a reliability level that is currently set for the storage region. When the calculated number of error bits is equal to or less than an upper reference value, and greater than or equal to a lower reference value, a reliability level that is currently set for the storage region is maintained.

Figure 3:
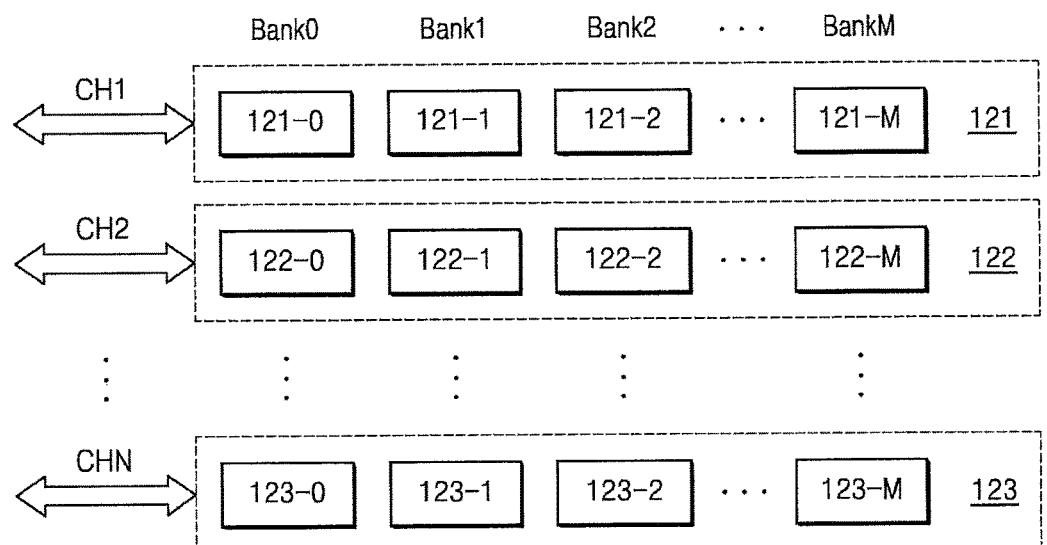
FIG. 3 illustrates a view of a detailed structure of channels and banks of the memory device shown in FIG. 1.

FIG. 3 illustrates a view of a detailed structure of channels and banks of the memory device 120 shown in FIG. 1.

A plurality of flash memory devices 121, 122, and 123 may be electrically connected to corresponding channels CH1 to CHN. Each of the channels CH1 to CHN may refer to as an independent bus via which a command, an address and data may be transmitted to or received to or from the flash memory devices 121, 122, and 123 that respectively correspond to the channels CH1 to CHN. Flash memory devices connected to different channels may operate independently from one another. The flash memory devices 121, 122, and 123 that are respectively connected to the channels CH1 to CHN may include a plurality of banks Bank0 to BankM. M+1 banks included in each of the channels CH1 to CHN may be connected to M+1 flash memory devices.

For example, flash memory devices 121 connected to a first channel CH1 may include M+1 banks Bank0 to BankM. The first channel CH1 may be connected to flash memory devices 121-0 to 121-M that respectively correspond to the M+1 banks Bank0 to BankM. The relationship among flash memory devices, channels, and banks described above may also be applied to flash memory devices 122 and 123.

A bank is a unit for identifying flash memory devices that share the same channel Flash memory devices may be identified according to the channel number and the bank number. A logical block address (LBA) transmitted from a host may define a channel number and a bank number of a flash memory device in which a request provided from a host may be performed In some embodiments, a physical page address may be allocated for a logical page address taking into account performance statuses of operations of requests provided from a host at channels and banks. In some embodiments, a physical page address may be allocated for a logical page address so that a request provided from a host may be performed in a bank that is sequentially shifted in a page unit in a channel.

Figure 4:
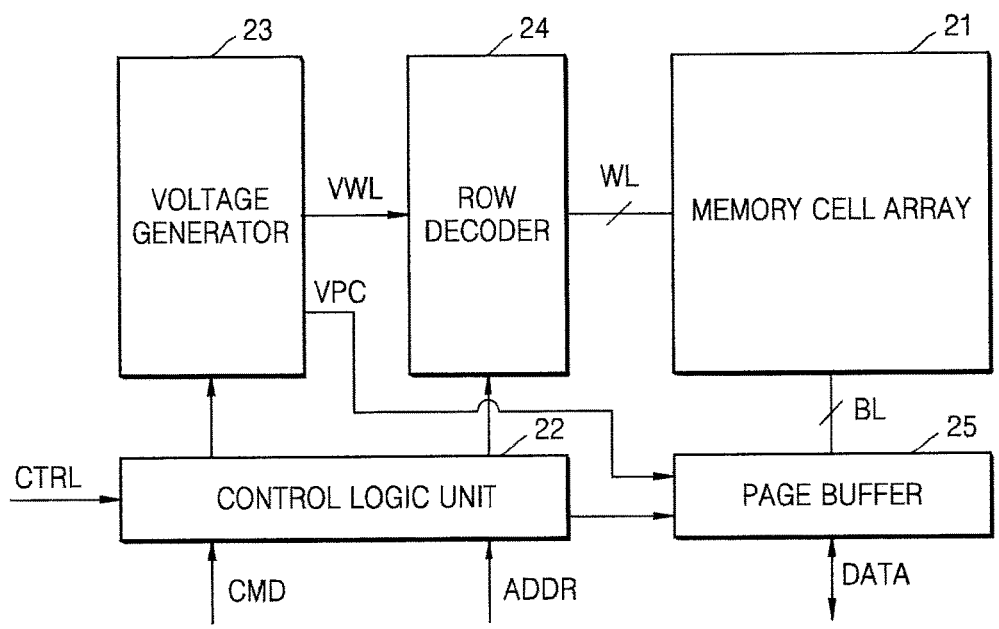
FIG. 4 illustrates an example view of a circuit configuration of a flash memory device included in the memory device of the non-volatile storage device shown in FIG. 1.

FIG. 4 illustrates an example view of a circuit configuration of a flash memory device 121-0 included in the memory device 120 of the non-volatile storage device 100 shown in FIG. 1.

Referring to FIG. 4, the flash memory device 121-0 may include a memory cell array 21, a control logic unit 22, a voltage generator 23, a row decoder 24, and a page buffer 25.

The control logic unit 22 may output various control signals for writing the data to the memory cell array 21 or reading the data from the memory cell array 21 based on a command CMD, an address ADDR, and a control signal CTRL received from the memory controller 110. Here, the various control signals output by the control logic unit 22 may be provided to the voltage generator 23, the row decoder 24, and the page buffer 25. For example, the control logic unit 22 may adjust a pre-charge voltage level and/or development time based on a control signal CTRL. In this case, the control signal CTRL may adjust at least one of a parameter value for determining a pre-charge voltage level and a parameter value for determining a development time.

The voltage generator 23 may receive the control signal from the control logic unit 22 to generate a drive voltage VWL for driving a plurality of word lines WL and a pre-charge voltage VPC for pre-charging a plurality of bit lines BL. In detail, the drive voltage VWL may be a write voltage (or a program voltage), a read voltage, an erase voltage, or a pass voltage.

The row decoder 24 may activate some of the plurality of word lines WL based on a received row address. In detail, during a read operation, the row decoder 24 may apply a read voltage to a selected word line and may apply a pass voltage to an unselected word line. Otherwise, during a write operation, the row decoder 24 may apply a write voltage to a selected word line and may apply a pass voltage to an unselected word line.

The page buffer 25 may be connected to the memory cell array 21 via the plurality of bit lines BL. The page buffer 25 may temporally store data to be recorded in the memory cell array 21 or data read from the memory cell array 21.

Accordingly, a read operation of cells of the selected page may be performed by using a development time and/or a pre-charge voltage of a bit line that are adjusted by the control logic unit 22.

Reading a cell in a read operation may include pre-charging, developing, and sensing. In the pre-charging, an operation in which a bit line is charged to a pre-charge level by applying a pre-charge voltage thereto is performed during a pre-charge period that is initially set. Next, in the developing, an operation in which a cell is discharged during a development time to read data of the cell is performed. Then, after the discharge of the cell during the development time, in sensing, when the voltage of the cell is measured to be greater than a first reference voltage V1, the cell is determined to be an off-cell, and when the voltage of the cell is measured to be less than a second reference voltage V2 (wherein V2<V1), the cell is determined to be an on-cell. In this regard, the speed of a read operation may be determined depending on a pre-charge voltage level and a development time.

In general, as the number of program/erase cycles or usage times increases, programming characteristics of memory cells degrade, thereby reducing the amount of current flow in the memory cells. When current flow through the memory cells decreases, cells may be read in an errorless manner by increasing development time or lowering pre-charge voltage levels.

Figure 5:
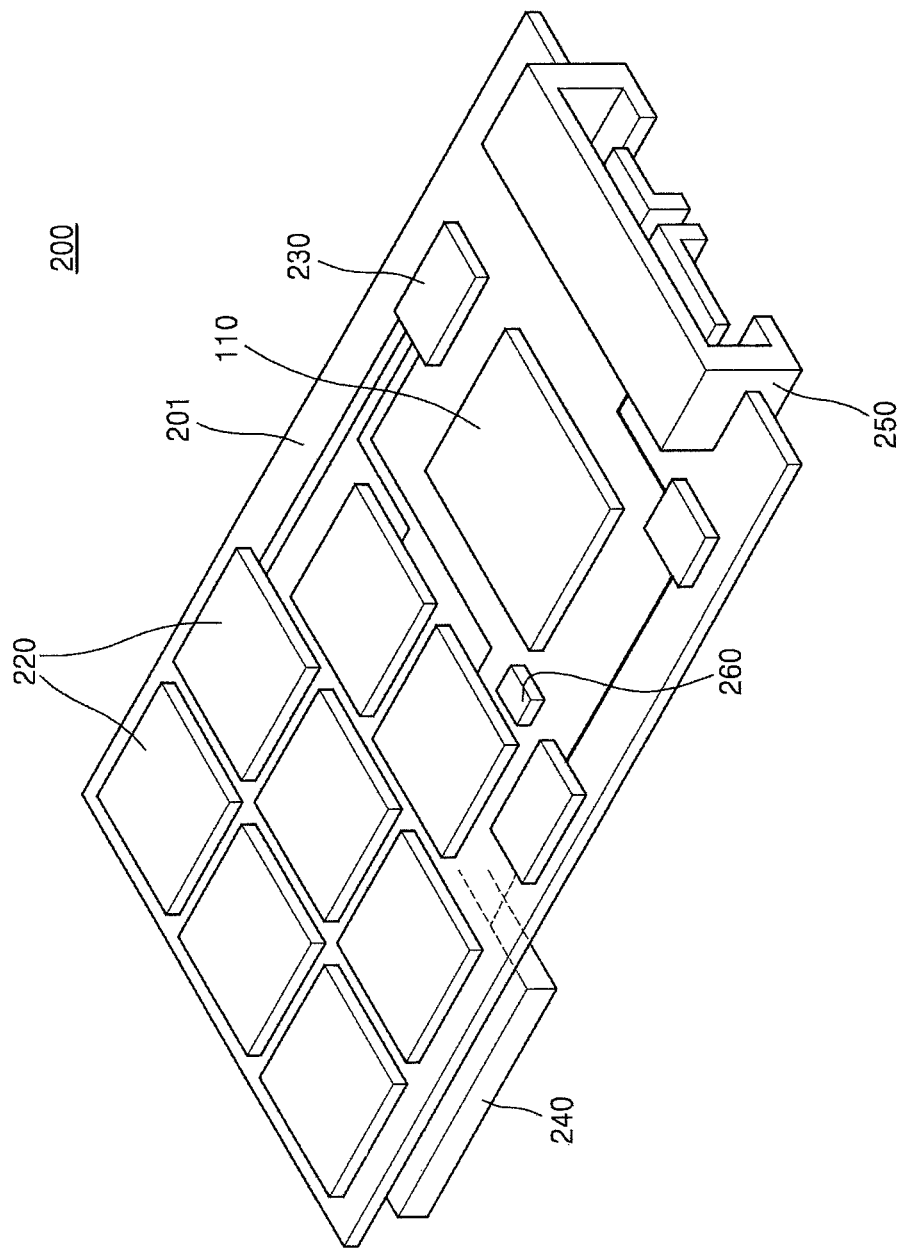
FIG. 5 illustrates an exploded perspective view showing main physical components of a non-volatile storage device according to an embodiment of the inventive concepts.

FIG. 5 illustrates an exploded perspective view showing main physical components of a non-volatile storage device 200 according to an embodiment of the inventive concepts.

Referring to FIG. 5, the non-volatile storage device 200 may include a substrate 201, the memory controller 110 mounted on the substrate 201, non-volatile memories 220, and a volatile memory 230.

The substrate 201 may be, for example, a printed circuit board (PCB) or a flexible printed circuit board (FPCB). The substrate 201 may include a connecting member such as a connector 250. Power may be supplied from an external power source, and data may be input from or output to an external host via the connecting member.

For example, the non-volatile memories 220 may be, but is not limited to, a flash memory, a phase-change RAM (PRAM), a resistive RAM (RRAIVI), a ferroelectric RAM (FeRAM), or a magnetic RAM (MRAM). The flash memory may be, for example a NAND flash memory. Each of the non-volatile memories 220 may be configured with a semiconductor die, or a stack of semiconductor dies.

The memory controller 110 may perform wear leveling, error correction, and/or fail block control. In addition, the memory controller 110 may include a program which is capable of transmitting or receiving a signal to or from an external device according to the Serial Advanced Technology Attachment (SATA) standard, Parallel Advanced Technology Attachment (PATA) standard, or Small Computer System Interface (SCSI) standard. The SATA standard includes all SATA standards, not only SATA-1 but also SATA-2, SATA-3, and external SATA (e-SATA). The PATA standard includes all integrated drive electronics (IDE) standards such as IDE or enhanced-IDE (E-IDE). The present specification incorporates the Serial ATA Revision 2.6, which was published by the Serial ATA International Organization on Feb. 15, 2007 in its entirety by reference.

The volatile memory 230 may be further mounted on the substrate 201. The volatile memory 230 may be, for example, a dynamic random access memory (DRAM). The volatile memory 230 may serve as a buffer when data is exchanged between the non-volatile memory 220 and the memory controller 110.

The substrate 201 may further include an auxiliary power supply 240. The auxiliary power supply 240 may be a super capacitor or a rechargeable secondary battery. The secondary battery may be, for example, a lithium ion battery, a lithium polymer battery, a nickel metal hydride battery (NiMH), a nickel cadmium battery, or a lithium air battery.

The substrate 201 may further include a temperature measuring sensor 260 for measuring temperature. The temperature measuring sensor 260 may transmit a temperature output value to the memory controller 110 via one or more wires formed on the substrate 201.

Examples of the temperature measuring sensor 260 may include a resistance temperature detector (RTD) and a thermistor. The RTD is a temperature sensor for detecting temperature by measuring a change in resistance of a metal, especially a metal having a resistance that easily fluctuates depending on temperature. Examples of the metal may include platinum (Pt). A thermistor is a semiconductor device including at least one sintered oxide of manganese, nickel, copper, cobalt, chromium, and iron, which have a resistance sensitively changing based on temperature. Such a characteristic makes the thermistor a commonly used temperature sensor. A thermistor may be manufactured and used in various forms. Examples of a thermistor may include a thermistor chip in which electrodes are formed at both ends of a thermistor.

Firmware for controlling a temperature of the non-volatile storage device 200 by receiving an input of a temperature value from the temperature measuring sensor 260 is stored in the memory controller 110. Hereinafter, a method of controlling the temperature of the non-volatile storage device 200, which is performed by the firmware, is described.

FIG. 6 illustrates a flowchart showing a method of controlling the temperature of the non-volatile storage device 200, according to example embodiments of the inventive concepts.

Referring to FIG. 6, when the non-volatile storage device 200 starts to operate, a data I/O performance level P is set to a maximum data I/O performance level (S10) Pmax. Here, the data I/O performance level P may be represented by a data I/O speed, but embodiments are not limited thereto. The data I/O speed may be controlled by adjusting, for example, the number of data I/O channels, the number of ways, and/or a data write/read time, especially a data write/read time in a non-volatile memory.

The data write/read time may be controlled by adjusting speed of a write/read operation with respect to the non-volatile memory 220. The speed of the write/read operation with respect to the non-volatile memory 220 may be controlled by, for example, in the case of a NAND memory, a Tprog function. The Tprog function may be linked to firmware for controlling a temperature, which is stored in the memory controller 110.

Then, a temperature T of the non-volatile storage device 200 is measured by using the temperature measuring sensor 260 (S20).

The temperature T of the non-volatile storage device 200 may be represented by an output from the temperature measuring sensor 260 provided in the non-volatile storage device 200. The location of the temperature measuring sensor 260 in the non-volatile storage device 200 may be determined taking this into account. In some embodiments, the temperature measuring sensor 260 may be installed near a component having a temperature which needs to be controlled the most tightly among components of the non-volatile storage device 200. In some embodiments, the temperature measuring sensor 260 may be installed near or on a surface of at least one of the memory controller 110, the volatile memory 230, the non-volatile memory 220, and the substrate 201. In some embodiments, the temperature measuring sensor 260 may be installed near or on a surface of the non-volatile memory 220. In some embodiments, the temperature measuring sensor 260 may be installed in the volatile memory 230, the non-volatile memory 220, or on an active surface of a semiconductor inside a logic chip.

Next, it is determined whether a measured temperature T is greater than a control engagement temperature Tc (S40).

When the measured temperature T is not greater than the control engagement temperature Tc, the data I/O performance level P may be set to be the maximum data I/O performance level (S10).

When the measured temperature T is greater than the control engagement temperature Tc, the data I/O performance level P may be controlled according to a predetermined rule (S50).

For example, the data I/O performance level P may be controlled according to Formula (1) below.

$$P = P_{max} \times f\left(\frac{\Delta T}{\Delta T_b}\right) \quad (1)$$

Here, $P_{max}$ denotes the maximum data I/O performance level of the non-volatile storage device 200.

In other words, the data I/O performance level P may be controlled depending on a variable ($\Delta T/\Delta T_b$). The variable ($\Delta T/\Delta T_b$) will be described in detail below.

A function of $f(\Delta T/\Delta T_b)$ having the variable ($\Delta T/\Delta T_b$) may be represented by, for example, Formula (2) below.

$$P = P_{max} \times \beta \times \left(1 - \alpha \frac{\Delta T}{\Delta T_b}\right) \quad (2)$$

Figure 7:
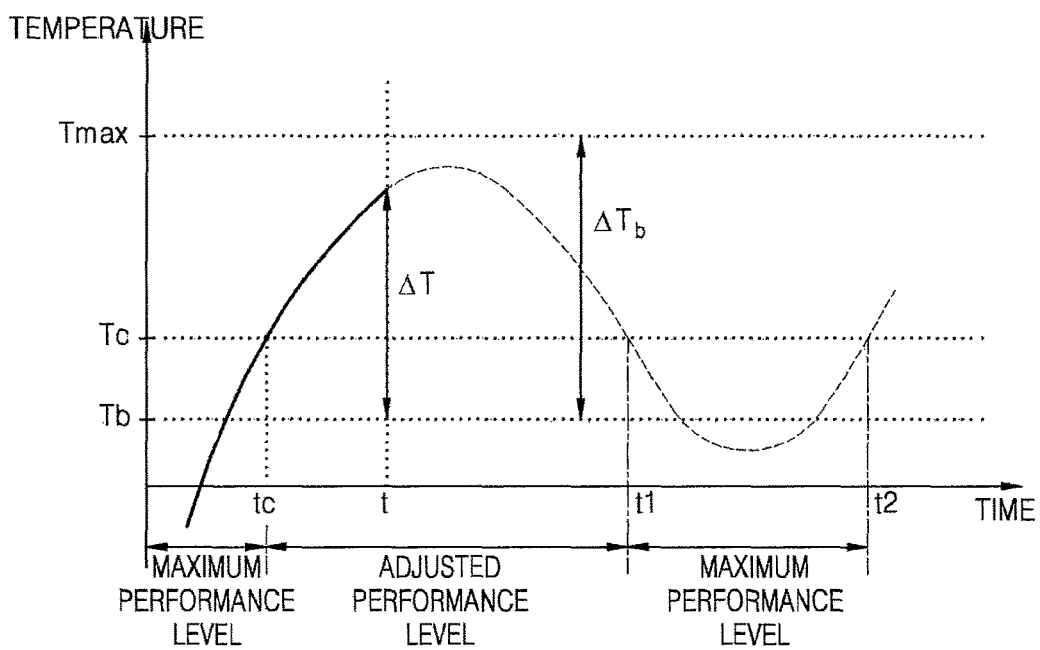
FIG. 7 is a graph showing an expected temperature profile over time.

Detailed descriptions of variables in Formulae (1) and (2) are provided with reference to FIG. 7. FIG. 7 is a graph showing an imaginary temperature profile over time.

Referring to FIG. 7, a time profile up to a current time t is shown as a solid line, and it is assumed that the temperature of the non-volatile storage device 200 changes along the curved dotted line after the current time t.

$T_{max}$ denotes the maximum permissible temperature T of the non-volatile storage device 200. The non-volatile storage device 200 may be controlled not to exceed the $T_{max}$, and, as necessary, $T_{max}$ may be used as a guideline for controlling the temperature of the non-volatile storage device 200.

The control engagement temperature Tc denotes a temperature from which temperature control begins. The non-volatile storage device 200 operates at the maximum performance level while the temperature T of the non-volatile storage device 200 remains equal to or less than Tc, until time tc. After time tc, the temperature T increases to above Tc, and the non-volatile storage device 200 operates at a performance level adjusted according to Formula (2). The non-volatile storage device 200 may operate at the adjusted performance level until the temperature T of the non-volatile storage device 200 decreases back to Tc (at time t1), at which the non-volatile storage device 200 may again operate at the maximum performance level. After the non-volatile storage device 200 operates at the maximum performance level again, the temperature T of the non-volatile storage device 200 reaches at Tc again (at t2), and then, the temperate T is controlled again to operate at the adjusted performance level.

In Formula (2), $\Delta T$ denotes the difference between the temperature T of the non-volatile storage device 200 and a reference temperature Tb, and $\Delta T_b$ denotes the difference between the maximum permissible temperature $T_{max}$ of the non-volatile storage device 200 and the reference temperature Tb. The reference temperature Tb serves as a reference point to calculate $\Delta T$ and $\Delta T_b$, and may be selected based on matching of the non-volatile storage device 200. The reference temperature Tb may be, for example, lower than the control engagement temperature Tc. However, embodiments are not limited thereto.

The $T_{max}$, Tc, and Tb may be stored in the memory controller 110, the non-volatile memory 220, or the like.

Also, $\alpha$ and $\beta$ in Formula (2) may be parameters that may be each independently determined taking into account control performance levels. Detailed descriptions thereof will be provided below.

Referring back to FIG. 6, the control loop may be repeated at predetermined time intervals until the operation of the non-volatile storage device 200 terminates (S30). In other words, it is determined whether there is an operation termination request for terminating an operation of the non-volatile storage device 200, and then, when there is no operation termination request, the control loop may be continuously repeated at the predetermined time intervals. The operation termination request may be, for example, received from a host.

For example, the predetermined time interval may be, but is not limited to, any interval ranging from about one second to about one hour. In some embodiments, the time interval may be in a range of about one second to about ten minutes. In some embodiments, the time interval may be in a range of about one second to about one minute.

Figure 8:
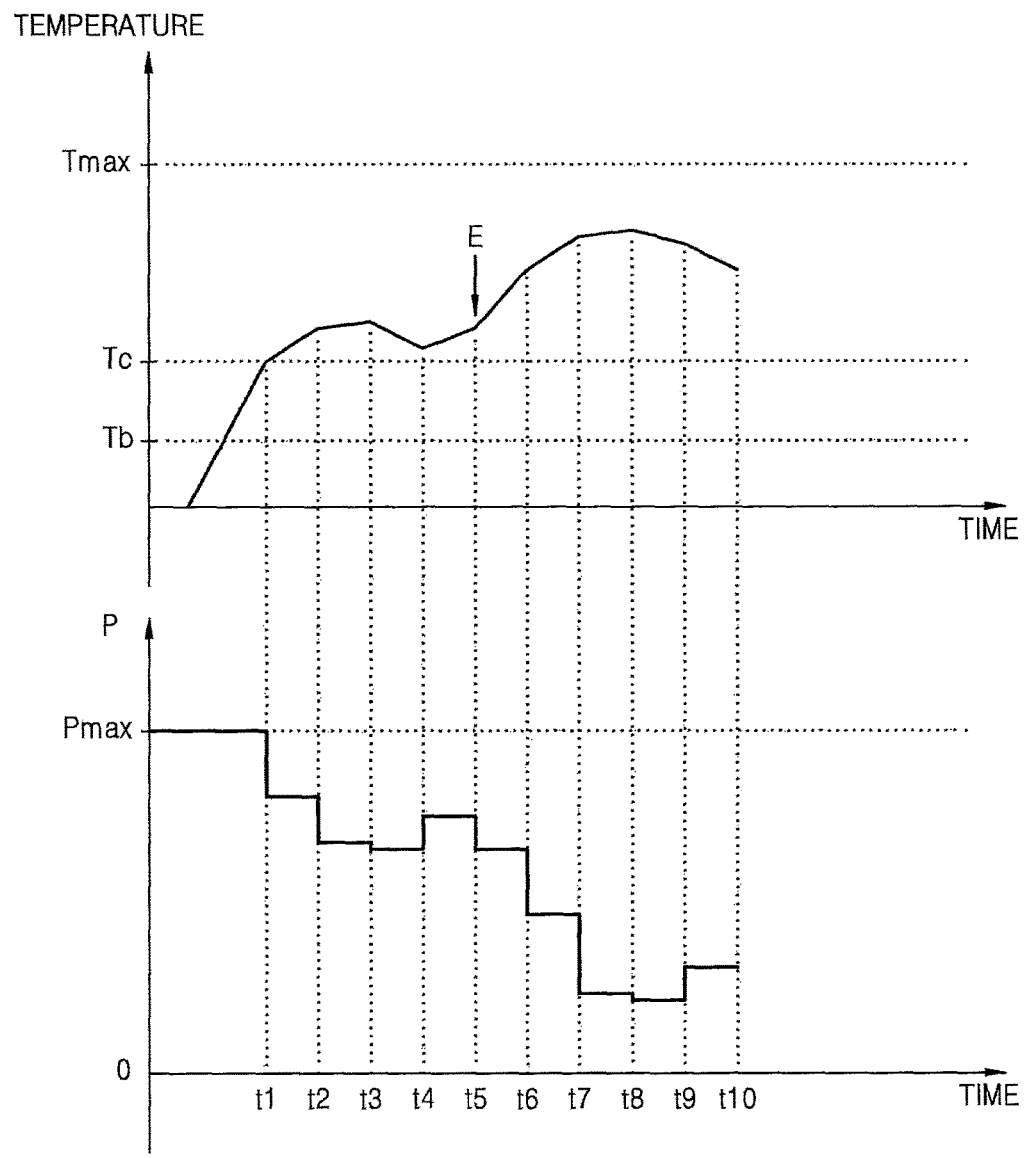
FIG. 8 illustrates a graph showing a change in the data I/O performance level P with respect to a change in temperature of the non-volatile storage device.

FIG. 8 is a graph showing changes in the data I/O performance level P with respect to changes in temperature of the non-volatile storage device 200.

Referring to FIG. 8, the performance level P of the non-volatile storage device 200 is not controlled until time t1 when the temperature of the non-volatile storage device 200 reaches Tc. That is, the performance level P of the non-volatile storage device 200 may remain at $P_{max}$ until time t1.

The memory controller 110 detects that the temperature T of the non-volatile storage device 200, which is measured at t1, exceeds Tc and then, controls the data I/O performance level P according to Formula (2). Accordingly, the data I/O performance level P at t1 may be, for example, reduced to 0.75 $P_{max}$.

Since the data I/O performance level P dramatically decreases, a temperature rise rate of the non-volatile storage device 200 also decreases. If the temperature continuously increases between time t2 and time t3, the data I/O performance level P continuously decreases. However, if the increased temperature decreases, the decreased data I/O performance level P may also decrease.

At t4, if the memory controller 110 detects that the temperature T of the non-volatile storage device 200 decreases, the data I/O performance level P may increase again according to Formula (2).

It is assumed that the temperature T of the non-volatile storage device 200 dramatically increases due to, for example, an external environmental change E which occurred at t5. The external environmental change E may be, for example, a breakdown of an external cooling apparatus such as an air conditioner, a partial stoppage of a ventilator, or the like.

In this case, a dramatic increase in the temperature T may occur from t5 to t6. At t6, the data I/O performance level P decreases corresponding to the increase of the temperature T, but the decrease in the data I/O performance level P may not be sufficient. In this regard, the temperature T further increases until t7, and thus, the data I/O performance level P may further decrease.

If the temperature T of the non-volatile storage device 200 increases until t8, and then decrease at t9, the data I/O performance level P increases again. However, as the temperature T is close to $T_{max}$, the data I/O performance level P is relatively low compared to $P_{max}$. When the temperature T decreases below the control engagement temperature Tc, the data I/O performance level P may increase again to the maximum I/O performance level $P_{max}$.

The parameters α and β in Formula (2) are adjusted, and thus, the change in data I/O performance level P due to the change in the temperature T of the non-volatile storage device 200 may be adjusted.

For example, when the value of β is set between 0 and 1, the temperature T of the non-volatile storage device 200 may rapidly decrease. As the value of β decreases closer to zero, the decrease in data I/O performance level P becomes larger, thereby rapidly decreasing the temperature T of the non-volatile storage device 200.

Also, when the value of α is large, the data I/O performance level P is small, and thus, the temperature T of the non-volatile storage device 200 may rapidly decrease. When the value of α is small, the temperature T of the non-volatile storage device 200 may slowly decrease.

Accordingly, taking into account the above-mentioned descriptions, the values of the parameters α and β may be adjusted as necessary.

Although the control engagement temperature Tc is greater than the reference temperature Tb in FIGS. 7 and 8, embodiments are not limited thereto. The control engagement temperature Tc may be set to be the same as the reference temperature Tb, or the control engagement temperature Tc may be set to be less than the reference temperature Tb.

Conventionally, to control the temperature of a non-volatile storage device, an "on-off" method in which the temperature is controlled by switching only between the maximum performance level and a pre-set minimum performance level, or a method in which a pre-set performance level is allocated for each temperature interval and the non-volatile storage device automatically operates at pre-set performance levels allocated to the temperature intervals, has been used. When a non-volatile storage device operates at a high performance level and the temperature thereof is required to be controlled by such methods, performance of the non-volatile storage device is unnecessarily sacrificed.

However, according to an example embodiment of this specification, since a non-volatile storage device operates at the maximum performance level of a specific temperature interval, the non-volatile storage device may operate at the maximum performance level in a temperature range in which the non-volatile storage device is protected from heat.

By using a method of controlling a temperature of a non-volatile storage device according to an example embodiment of the inventive concepts, the non-volatile storage device may operate at the maximum performance level in a range in which the non-volatile storage device is protected from heat.

Figure 9:
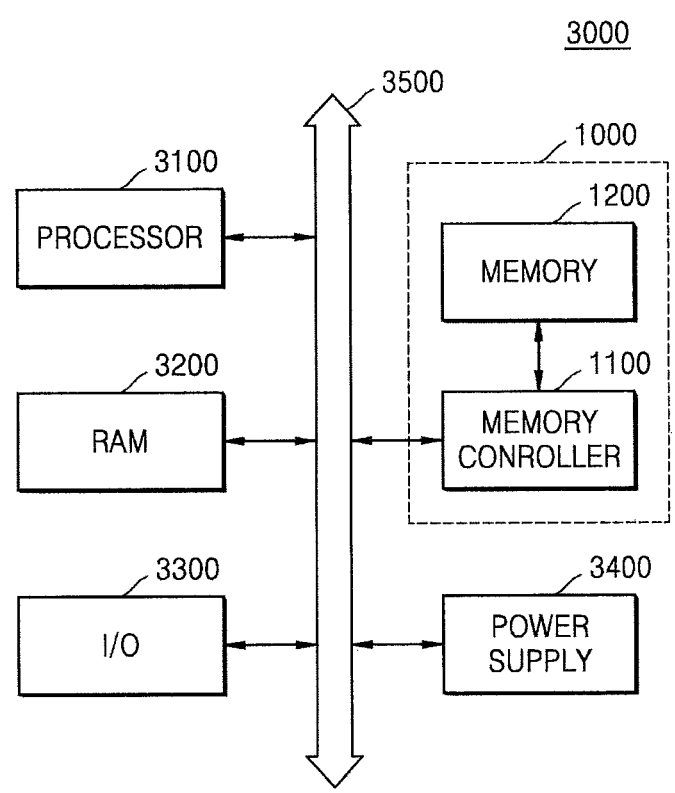
FIG. 9 illustrates a block diagram of a computing system including non-volatile storage device according to an example embodiment of the inventive concepts.

FIG. 9 illustrates a block diagram of a computing system including non-volatile storage devices 100 and 200 according to an example embodiment of the inventive concepts.

Referring to FIG. 9, the computing system 3000 may include a processor 3100, a RAM 3200, an I/O device 3300, a power supply 3400, and a memory system 1000. Although not illustrated in FIG. 9, the computing system 3000 may further include ports capable of communicating with a video card, a sound card, a memory card and a USB apparatus, or communicating with other electronic devices. The computing system 3000 may be embodied as a personal computer (PC) or a portable electronic device, such as a laptop computer, a portable phone, a personal digital assistant (PDA) or a camera. The memory system 1000 may be embodied as the non-volatile storage devices 100 and 200 illustrated in FIG. 1 or 5.

The processor 3100 may perform specific calculations or tasks. In some embodiments, the processor 3100 may be a microprocessor (MP) or a central processing unit (CPU). The processor 3100 may communicate with the RAM 3200, the I/O device 3300, and the memory system 1000 through a bus 3500, such as an address bus, a control bus, and a data bus. In some embodiments, the processor 3100 may be connected to an expansion bus, such as a peripheral computer interconnect (PCI) bus.

The RAM 3200 may store data required for an operation of the computing system 3000. For example, the memory device 3200 may be embodied as a DRAM, a mobile DRAM, an SRAM, a PRAM, an FRAM, an RRAM, and/or an MRAM.

The I/O device 3300 may include an input unit, such as a keyboard, a keypad, or a mouse, and an output unit, such as a printer or a display unit. The power device 3400 may supply an operation voltage required for the operation of the computing system 3000.

Figure 10:
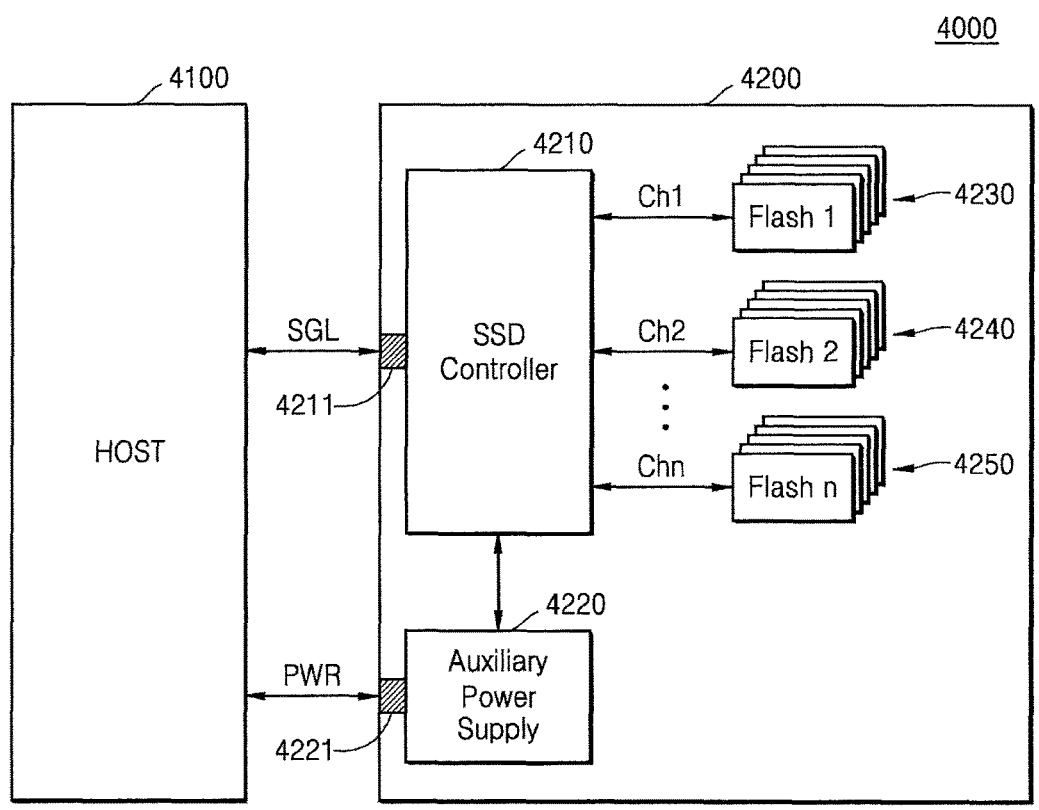
FIG. 10 is a block diagram illustrating an example in which non-volatile storage device according to an example embodiment of the inventive concepts is applied to an SSD.

FIG. 10 is a block diagram illustrating an example in which non-volatile storage devices 100 and 200 according to an example embodiment of the inventive concepts are applied to an SSD.

Referring to FIG. 10, an SSD system 4000 may include a host 4100 and an SSD 4200. The SSD 4200 may transmit/receive signals to/from the host 4100 through a signal connector 4211 and receive power through a power connector 4221. The SSD 4200 may include an SSD controller 4210, an auxiliary power supply 4220, and a plurality of memory devices 4230, 4240 and 4250. In this case, the SSD controller 4210 or the plurality of memory devices 4230, 4240 and 4350 may be embodied as the memory controller 110 or the memory device 120 illustrated in FIG. 1.

Figure 11:
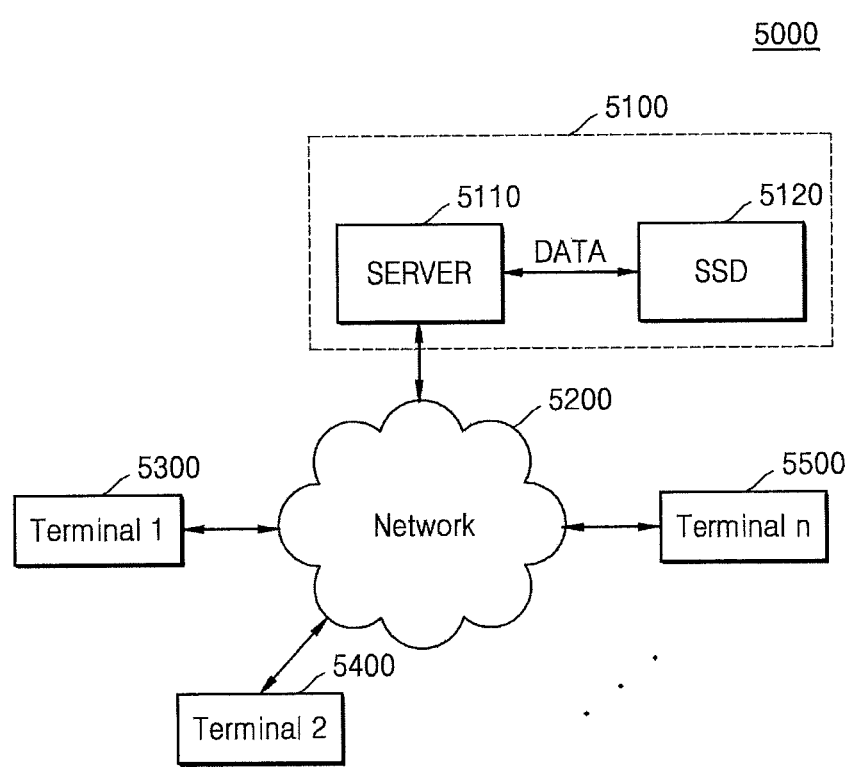
FIG. 11 illustrates a block diagram of a server system and a network system including the SSD of FIG. 10.

FIG. 11 illustrates a block diagram of a server system and a network system including the SSD of FIG. 10.

Referring to FIG. 11, a network system 5000 according to an embodiment of the inventive concepts may include a server system 5100 and multiple terminals 5300, 5400 and 5500 which are connected over a network 5200. The server system 5100 according to an embodiment of the inventive concepts may include a server 5110 that processes a request received from the multiple terminals 5300, 5400 and 5500 connected to the network 5200 and an SSD 5120 that stores data corresponding to the request received from the terminals 5300, 5400 and 5500. Here, the SSD 5120 may be the same as the SSD 4000 of FIG. 10.

The above-described flash memory system according to the inventive concepts may be configured using various types of packages. For example, the memory system according to the inventive concepts may be configured using packages such as a Package on Package (PoP), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic MetricQuad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), and a Wafer-Level Processed Stack Package (WSP).

While the inventive concepts have been particularly shown and described with reference to example embodiments thereof, it will be understood that various changes in form and details may be made therein without departing from the spirit and scope of the following claims.

What is claimed is:

1. A method of controlling a temperature of a non-volatile storage device, the method comprising:
   detecting the temperature of the non-volatile storage device which is represented by a value measured by a temperature measuring sensor;
   determining whether the temperature of the non-volatile storage device is higher than a control engagement temperature; and
   adjusting a data I/O performance level P according to Formula 1 below if the temperature of the non-volatile storage device is higher than the control engagement temperature, $$P = P_{max} \times \beta \times \left(1 - \alpha \frac{\Delta T}{\Delta T_b}\right) \quad (1)$$

wherein, $P_{max}$ denotes a maximum data I/O performance level of the non-volatile storage device, $\Delta T$ denotes a difference between the temperature of the non-volatile storage device and a reference temperature, $\Delta T_b$ denotes a difference between a maximum threshold temperature of the non-volatile storage device and the reference temperature, wherein $\Delta T_b$ is greater than zero, and $\alpha$ and $\beta$ are control parameters of the non-volatile storage device, the non-volatile storage device comprises:
   a substrate; and
   a memory controller, a volatile memory, and a non-volatile memory that are mounted on the substrate, and wherein the temperature measuring sensor is disposed on a surface of or adjacent to at least one of the memory controller, the volatile memory, the non-volatile memory, and the substrate, the memory controller is configured to receive a temperature value from the temperature measuring sensor, and based on the received temperature value, the memory controller is configured to control the data I/O performance level according to Formula 1.

2. The method of claim 1, wherein the data I/O performance level is a data I/O speed.

3. The method of claim 2, wherein the adjusting of the data I/O performance level P comprises controlling at least one of a number of data I/O channels and a number of ways, in order to control the data I/O speed.

4. The method of claim 2, wherein the adjusting of the data I/O performance level P comprises controlling a speed of a write/read operation with respect to the non-volatile storage device, in order to control the data I/O speed.

5. The method of claim 4, wherein the controlling of speed of the write/read operation with respect to the non-volatile storage device is performed according to a Tprog function.

6. The method of claim 1, wherein the reference temperature is lower than the control engagement temperature.

7. The method of claim 1, wherein the memory controller comprises a firmware capable of performing the determining of whether the temperature of the non-volatile storage device is higher than the control engagement temperature and the adjusting of the data I/O performance level P.

8. The method of claim 1, further comprising, after the adjusting of the data I/O performance level P:
   determining whether the temperature of the non-volatile storage device is lower than the control engagement temperature; and
   setting the data I/O performance level P to a maximum data I/O performance level $P_{max}$ if the temperature of the non-volatile storage device is lower than the control engagement temperature.

9. The method of claim 1, wherein the determining of whether the temperature of the non-volatile storage device is higher than the control engagement temperature is repeated at intervals.

10. The method of claim 9, wherein a period for the determining of whether the temperature of the non-volatile storage device is higher than the control engagement temperature is in a range of about one second to about one hour.

11. The method of claim 9, further comprising adjusting the data I/O performance level P according to Formula 1 if the temperature of the non-volatile storage device is higher than the control engagement temperature.

12. A method of controlling a temperature of a non-volatile storage device, the non-volatile storage device comprising a substrate and a memory controller, a volatile memory, and a non-volatile memory that are mounted on the substrate, the method comprising:

detecting a temperature at predetermined time intervals by using a temperature measuring sensor and sending a temperature value to the memory controller; and controlling, by using the memory controller, a speed of a write/read operation with respect to the non-volatile memory based on the temperature value, wherein the controlling of the speed of the write/read operation with respect to the non-volatile memory comprises:

setting the write/read speed to a maximum value if the temperature is less than or equal to a control engagement temperature, and applying at least one of (a), (b), and (c) according to Formula 2 below if the temperature is higher than the control engagement temperature, $$P = P_{max} \times f\left(\frac{\Delta T}{\Delta T_b}\right) \quad (2)$$

(a) reducing a number of data I/O channels;
    (b) reducing a number of data I/O ways; and
    (c) decreasing a speed of a data write/read operation with respect to the non-volatile memory, wherein P denotes a data I/O performance level,
    $P_{max}$ denotes a maximum data I/O performance level of the non-volatile storage device,
    $\Delta T$ denotes a difference between the temperature of the non-volatile storage device and a reference temperature, and
    $\Delta T_b$ denotes a difference between a maximum threshold temperature of the non-volatile storage device and the reference temperature, wherein $\Delta T_b$ is greater than zero,
    wherein the temperature measuring sensor is disposed on a surface of or adjacent to at least one of the memory controller, the volatile memory, the non-volatile memory, and the substrate.

13. The method of claim 12, wherein Formula 2 below is identical to Formula 1, $$P = P_{max} \times \beta \times \left(1 - \alpha \frac{\Delta T}{\Delta T_b}\right) \quad (2)$$

wherein, α and β are control parameters of the non-volatile storage device.

14. The method of claim 12, wherein the controlling of the speed of the write/read operation with respect to the non-volatile memory comprises applying (c) decreasing the speed of the data write/read operation with respect to the non-volatile memory.

15. The method of claim 14, wherein the decreasing the speed of the data write/read operation with respect to the non-volatile memory is performed according to a Tprog function.

16. A method of controlling a temperature of a non-volatile storage device, the non-volatile storage device comprising a substrate; and a memory controller, a volatile memory, and a non-volatile memory that are mounted on the substrate, the method comprising:

setting a data I/O performance level to a maximum level;

detecting the temperature of the non-volatile storage device using a temperature measuring sensor disposed on a surface of or adjacent to at least one of the memory controller, the volatile memory, the non-volatile memory, and the substrate;

determining whether the temperature of the non-volatile storage device is higher than a control engagement temperature; and adjusting the data I/O performance level to a value lower than the maximum level if the temperature of the non-volatile storage device is higher than the control engagement temperature, or keeping the data I/O performance level at the maximum level if the temperature of the non-volatile storage device is equal to or lower than the control engagement temperature, wherein the non-volatile storage device includes a NAND memory, and the adjusting of the data I/O performance level comprises controlling a speed of a write/read operation with respect to the non-volatile storage device by using a Tprog function, in order to control data I/O speed.

17. The method of claim 16, wherein adjusting the data I/O performance level P includes adjusting the data I/O performance level according to Formula 1 below $$P = P_{max} \times \beta \times \left(1 - \alpha \frac{\Delta T}{\Delta T_b}\right) \quad (1)$$

wherein $P_{max}$ denotes the maximum level of the data I/O performance level of the non-volatile storage device,
    $\Delta T$ denotes a difference between the temperature of the non-volatile storage device and a reference temperature,
    $\Delta T_b$ denotes a difference between a maximum threshold temperature of the non-volatile storage device and the reference temperature, wherein $\Delta T_b$ is greater than zero, and
    α and β are control parameters of the non-volatile storage device.

* * * * *